United States Patent [19]

El-Ayat et al.

[11] Patent Number: 5,194,759
[45] Date of Patent: Mar. 16, 1993

[54] METHODS FOR PREVENTING DISTURBANCE OF ANTIFUSES DURING PROGRAMMING

[75] Inventors: Khaled A. El-Ayat, Palo Alto; Kenneth D. Hayes, San Jose; Theodore M. Speers, San Leandro; Gregory W. Bakker, Sunnyvale, all of Calif.

[73] Assignee: Actel Corporation, Sunnyvale, Calif.

[21] Appl. No.: 835,221

[22] Filed: Feb. 13, 1992

Related U.S. Application Data

[63] Continuation of Ser. No. 525,763, May 18, 1990, abandoned.

[51] Int. Cl.$^5$ .................. H01H 37/76; H03K 19/173
[52] U.S. Cl. ................. 307/202.1; 307/465; 307/468; 365/225.7
[58] Field of Search ............ 307/202.1, 465, 468; 365/96, 225.7

[56] References Cited

U.S. PATENT DOCUMENTS

| | | | |
|---|---|---|---|
| 4,703,206 | 10/1987 | Cavlan | 307/465 |
| 4,758,745 | 7/1988 | Elgamal et al. | 307/465 |
| 4,823,181 | 4/1989 | Mohsen et al. | 357/51 |
| 4,868,426 | 9/1989 | Brockman | 307/465 |
| 4,873,459 | 10/1989 | El Gamal et al. | 307/465 |
| 4,874,968 | 10/1989 | Brockman et al. | 307/465 |
| 4,881,114 | 11/1989 | Mohsen et al. | 357/54 |
| 4,899,205 | 2/1990 | Hamdy et al. | 357/51 |
| 4,935,645 | 6/1990 | Lee | 307/362 |
| 4,985,649 | 1/1991 | Schuett et al. | 307/465 |
| 5,015,885 | 5/1991 | El Gamal et al. | 307/465 |

Primary Examiner—John S. Heyman
Assistant Examiner—Terry D. Cunningham
Attorney, Agent, or Firm—Kenneth D'Alessandro

[57] ABSTRACT

A method to minimize disturbance of an already programmed antifuse while programming other antifuses in a circuit includes the steps of determining a preferred order in which to program the antifuses and programming them in the preferred order. High initial programming and soak currents are selected such that the disturb current is small with respect thereto. The magnitude of the disturb current is increased to a value that maintains the antifuse resistance or improves it rather than adversely affect it. Where a circuit node containing a first already programmed antifuse is positioned such that parasitic capacitances may discharge through that antifuse during the programming of a second antifuse, the magnitude of the charge stored at parasitic capacitances associated with the programming path is reduced by reducing the programming voltage when this programming situation is detected. After the initial rupturing of the antifuse dielectric is detected, the programming voltage is increased to its normal value for the soaking period.

1 Claim, 2 Drawing Sheets

METHODS FOR PREVENTING DISTURBANCE OF ANTIFUSES DURING PROGRAMMING

RELATED APPLICATIONS

This application is a continuation of co-pending application Ser. No. 07/525,763, filed May 18, 1990, now abandoned.

BACKGROUND OF THE INVENTION

1. Field of the Invention

The present invention relates to user-programmable circuits. More specifically, the present invention relates to antifuse elements for use in such circuits and to methods for programming such antifuse elements. In particular, the present invention relates to methods for minimizing the disturbance to already programmed antifuses caused by subsequent programming of other antifuses.

2. The Prior Art

Antifuses, such as those disclosed in U.S. Pat. Nos. 4,823,181 and 4,899,205 are programmed using known methods. In addition, such antifuses disposed in circuit architectures such as disclosed in U.S. Pat. No. 4,758,745 may be programmed by known methods. Co-pending application Ser. No. 381,630, filed Jul. 19, 1989, now U.S. Pat. No. 5,008,855, and co-pending application Ser. No. 07/523,978, entitled Method of Reducing Antifuse Resistance During Programming, filed May 16, 1990, commonly owned with the instant application, disclose methods for programming such antifuses in such circuit architectures. These applications and patents are hereby incorporated by reference as if fully set forth.

The process of programming a given one of a plurality of antifuses within a single integrated circuit may "disturb" one or more previously programmed antifuses in the same circuit, i.e., affect the previously-programmed antifuse or antifuses in a manner which raises their on resistance. The effect of raising on resistance of antifuses by disturbing one or more antifuses in a circuit while programming others may seriously degrade the performance of the circuit of which the disturbed antifuse is a part.

An object of the invention is to eliminate or reduce the adverse effects of disturb cycles in antifuse programming sequence. The techniques of the present invention may be used in programming antifuses in a field-programmable gate array (FPGA) architecture.

BRIEF DESCRIPTION OF THE INVENTION

According to a first aspect of the present invention, a method to minimize disturbance of an already programmed antifuse while programming other antifuses in a circuit includes the steps of determining a preferred order in which to program the antifuses and programming them in the preferred order.

According to a second aspect of the present invention, high initial programming and soak currents are selected such that the disturb current is small with respect thereto. By using higher soaking currents, it is assured that the disturb current is small with respect to the soak current and the amount of disturbance is minimized.

According to a third aspect of the present invention, the magnitude of the disturb current is increased to a value that maintains the antifuse resistance or improves it rather than adversely affect it. This may be accomplished by turning off the transistor shunting the antifuse.

According to a fourth aspect of the present invention, where a circuit node containing a first already-programmed antifuse is positioned such that parasitic capacitances may discharge through that antifuse during the programming of a second antifuse, the magnitude of the charge stored at parasitic capacitances associated with the programming path is reduced by reducing the programming voltage when this programming situation is detected. This results in a much lower charge and therefore a smaller AC disturb current. The reduction in programming voltage is chosen so that the resulting AC disturb current is negligible and has no effect on the antifuse resistance. After the initial rupturing of the antifuse dielectric is detected, the programming voltage is increased to its normal value for the soaking period.

DETAILED DESCRIPTION OF A PREFERRED EMBODIMENT

Antifuses are programmed by application of a high voltage across their two terminals. The programming voltage ($V_{pp}$) which may be used is typically 18 volts. After the antifuse dielectric ruptures, a conductive filament having a finite resistance is established between its two terminals. The antifuse may then be soaked with current for a period of time to optimize the resistance of the antifuse. Soak currents may typically be in the range of 3-15 mA.

Antifuses which are programmed with lower programming and soak current have a tendency to exhibit poor (i.e., high) final antifuse resistance. A main reason for the poor resistance is that subsequent programming cycles in the FPGA, intended for programming other antifuses, produce currents which disturb the earlier antifuses. These subsequent programming cycles will be referred to herein as "disturb cycles." Methods for minimizing the effects of these disturb cycles are the subject matter of the present invention.

Figure 1:
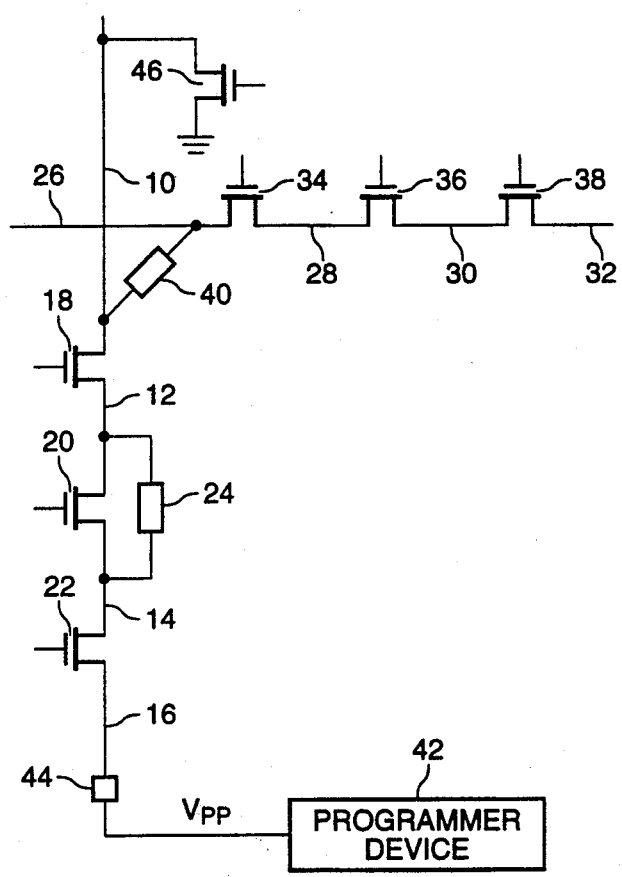
FIG. 1 is a schematic diagram of a typical circuit containing several antifuses and shunting series pass transistors illustrating one aspect of the present invention.

The antifuse disturb phenomena can be best understood by first referring to FIG. 1, which illustrates in schematic form a typical circuit containing several antifuses and shunting series-pass transistors. FIG. 1 illustrates a plurality of vertical wiring segments 10, 12, 14, and 16 joined together by series-pass transistors 18, 20 and 22. Antifuse 24 shunts series-pass transistor 20. A plurality of horizontal wiring segments 26, 28, 30, and 32 are joined together by series-pass transistors 34, 36 and 38. A second antifuse 40 is connected between vertical segment 10 and horizontal segment 26.

In order to program antifuse 24, a source of programming voltage $V_{pp}$ is applied to segment 10 (or segment 16) and ground is applied to segment 16 (or segment 10). Those of ordinary skill in the art will recognize that the commonly-employed method for applying these voltage potentials is to employ a $V_{pp}$ potential from a programmer device 42 to an I/O pin 44 on the integrated circuit device containing the antifuse circuitry of FIG.

1. Programmer devices, such as those available from Stag Microsystems, Inc. of Santa Clara, Calif., and Data I/O Corporation of Redmond, Wash., and their use for applying programming voltage potentials which may be raised and lowered under user control, are well known in the art. For simplicity, the I/O pin 44 is shown connected to segment 16 in FIG. 1, but those of ordinary skill in the art will recognize that other elements, such as high-voltage switching transistors may be interposed in the circuit path to steer the programming potential to the proper segment 16. Similarly, those of ordinary skill in the art know that segment 10 may be connected to ground potential in the integrated circuit containing the circuitry of FIG. 1 during the programming cycle by devices such as illustrative pulldown transistor 46. The details of such circuitry is beyond the scope of the present invention, but is taught in U.S. Pat. No. 4,758,745, incorporated herein by reference. Transistor 20 is connected in parallel with antifuse 24, so its gate is turned off. Transistors 18 and 22 have their gates turned on by connecting them to $V_{pp}$. The circuit thus applies the $V_{pp}$ voltage to one terminal of antifuse 24 and ground to the other terminal as disclosed in U.S. Pat. No. 4,758,745. After a short period of time, typically a few milliseconds, the antifuse programs and a resistance is established between its terminals. The antifuse may then be current soaked for a period of time (as described in co-pending application Ser. No. 07/523,978, filed May 16, 1990, entitled Method of Reducing Antifuse Resistance During Programming) to optimize the final antifuse resistance.

One type of disturb cycle referred to herein occurs while subsequently programming antifuse 40 after antifuse 24 has been programmed. $V_{pp}$ is applied to the terminals of antifuse 40 again by supplying $V_{pp}$ from one side through transistors 18, 20 and 22 while supplying ground through transistors 34, 36, and 38 as explained in U.S. Pat. No. 4,758,745. The gates of all transistors in this programming path are turned on with $V_{pp}$. Antifuse 40 programs the same way as did antifuse 24 and a resistance is established between its terminals.

During the current soaking cycle a current is passed through antifuse 40. As can be seen from FIG. 1, the soaking current travels through two parallel paths, programmed antifuse 24 and transistor 20. Because of the current passing through programmed antifuse 24, this programming cycle for antifuse 40 is referred to as a disturb cycle for antifuse 24 with the current through antifuse 24 as the disturb current.

Since the soaking current is divided between transistor 20 and already programmed antifuse 24, the disturb current may be relatively small if it is assumed that the on resistance of transistor 20 is lower than the programmed resistance of antifuse 24. If the disturb current is 1-3 Ma and antifuse 24 was previously programmed with a similar or slightly larger current than the disturb current, antifuse 24 will be disturbed and may end up with a very poor antifuse resistance value, i.e., 10 k-20 k ohms.

According to the present invention, a preferred solution to the disturb problem is to modify the antifuse programming order so that antifuse 40 is programmed before antifuse 24. In this case, no disturb current passes through antifuse 24. A subsequent programming cycle would then be used to program antifuse 24. In this instance, no disturb current will pass through antifuse 40 since the programming path does not use transistors 34, 36, and 38.

Another preferred solution to this problem according to the present invention is to design the programming path to deliver high initial programming and soak currents. By using higher soaking currents, it is assured that the disturb current is small with respect to the soak current and the amount of disturbance is minimized.

Another preferred solution according to the present invention for this architecture is to increase the magnitude of the disturb current to a value that maintains the antifuse resistance or improves it rather than adversely affect it. This may be accomplished by turning off transistor 20 so that all of the soaking current for antifuse 40 passes through already programmed antifuse 24.

Figure 2:
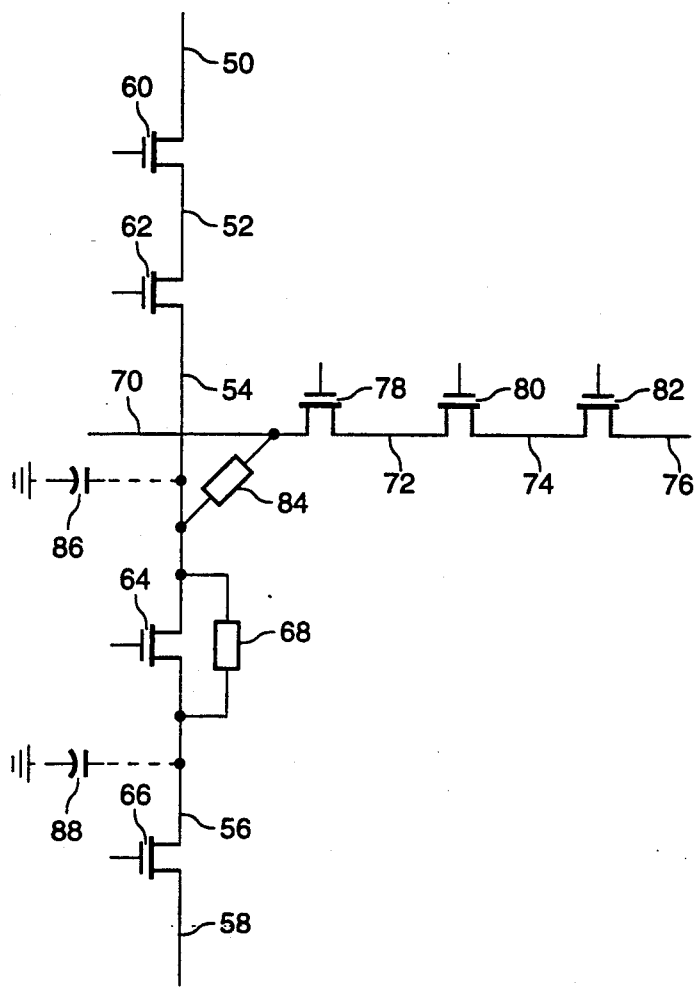
FIG. 2 is a schematic diagram of a typical circuit containing several antifuses and shunting series pass transistors illustrating a second aspect of the present invention.

Another type of disturb cycle which may be minimized using the techniques of the present invention will now be described with reference to FIG. 2. Referring now to FIG. 2, plurality of vertical segments 50, 52, 54, 56, and 58, are joined by series-pass transistor 60, 62, 64, and 66. Series-pass transistor 64 is shunted by anti-fuse 68. A plurality of horizontal wiring segments 70, 72, 74 and 76 are connected by series-pass transistor 78, 80 and 82. Anti-fuse 84 is connected between horizontal segments 70 and vertical segment 54. During the programming of anti-fuse 84, the high voltage $V_{pp}$ is propagated from the supply through wiring segments 50 and 52 and transistors 60 and 62 to the side of antifuse 84 connected to wiring segment 54. The other side of antifuse 84 is returned to ground through wiring segments 72, 74, and 76 and transistors 78, 80 and 82. If antifuse 68 has been previously programmed, the programming voltage $V_{pp}$ is also propagated to its other end and to wiring segment 56. Programming potentials may be applied to the circuit of FIG. 2 in the same manner disclosed in FIG. 1.

At this point in time, parasitic capacitances 86 and 88 associated with both ends of antifuse 68, i.e., the parasitic capacitances shown in phantom lines associated with wiring segments 54 and 56, are charged up with a charge equal to the voltage $V_{pp}$ multiplied by the capacitance seen at the respective node (Charge Q=C·V). When antifuse 84 initially ruptures, current flows through antifuse 84 to ground via wiring segments 72, 74, and 76 and transistors 78, 80 and 82 through two paths. The first path is the intended current path current from $V_{pp}$ at wiring segment 50 through transistors 60 and 62 and wiring segments 52 and 54. In addition, however, a second, unintended path exists as a capacitive discharge path for capacitance 86 at wiring segment 54 and capacitance 88 at wiring segment 56 through already-programmed antifuse 68. The AC transient caused by this capacitive discharge can be of a magnitude high enough to disturb antifuse 68. As the voltages on wiring segments 54 and 56 decay to the steady state final value, an AC current is drawn through antifuse 68. The magnitude of the AC current is determined by the initial charge stored at parasitic capacitances 86 and 88 and the rate of discharge of the circuit which is a function of the circuit. This AC current is a disturb current through previously programmed antifuse 68. It has been observed that this current adversely affects the resistance of antifuse 68.

According to the present invention, a preferred solution to this problem is to reduce the magnitude of the charge stored at parasitic capacitances 86 and 88. This is accomplished by reducing the programming voltage when this programming situation is detected. This results in a much lower charge and therefore a smaller AC disturb current. The reduction in programming voltage is chosen so that the resulting AC disturb current is negligible and has no effect on the antifuse resistance. In a preferred embodiment, a reduction of 2 volts in the programming voltage was sufficient to solve the AC disturb problem. After the initial rupturing of the dielectric of antifuse 84 is detected, $V_{pp}$ is increased to its normal value for the soaking period.

Another solution to this problem would be to modify the programming order of the antifuses whenever possible so that antifuse 84 is programmed prior to antifuse 68. This is not always possible in all architectures.

While presently-preferred embodiments of the invention have been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A method for minimizing disturbance to a first already programmed antifuse programmed at a programming voltage having a first magnitude developed between an ungrounded potential and a grounded potential caused by the subsequent programming of a second antifuse, including the steps of:

reducing the magnitude of said programming voltage to said second antifuse from said first magnitude to a second, lower magnitude when a condition exists that said first antifuse is electrically connected to a circuit node which will be at said ungrounded potential of said programming voltage to be applied during the programming of said second antifuse and further if said first antifuse is not in the path of programming current through said second antifuse;

applying said programming voltage of said second magnitude to said second antifuse;

increasing said programming voltage to said first magnitude when said second antifuse begins to draw current; and applying a programming voltage having one of said first and said second magnitudes to said second antifuse when said condition does not exist.

* * * * *